(12) United States Patent
Nakamura

(10) Patent No.: US 6,523,135 B1
(45) Date of Patent: Feb. 18, 2003

(54) BUILT-IN SELF-TEST CIRCUIT FOR A MEMORY DEVICE

(75) Inventor: Yoshiyuki Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/383,207

(22) Filed: Aug. 26, 1999

(30) Foreign Application Priority Data

Sep. 2, 1998 (JP) ............................................. 10-248352

(51) Int. Cl.[7] ................................................ G06F 11/27
(52) U.S. Cl. ........................ 714/30; 714/720; 714/733; 714/743
(58) Field of Search .............................. 714/30, 31, 42, 714/719, 720, 733, 738, 734, 735, 743

(56) References Cited

U.S. PATENT DOCUMENTS 6,182,257 B1 * 1/2001 Gillingham .................. 714/718
6,272,588 B1 * 8/2001 Johnston et al. ............. 365/201
6,338,154 B2 * 1/2002 Kim ............................ 365/201

FOREIGN PATENT DOCUMENTS

| JP | 61-54550 | 3/1986 |
| JP | 63-4500 | 1/1988 |
| JP | 8-100536 | 4/1996 |
| JP | 10-69799 | 3/1998 |

* cited by examiner

Primary Examiner—Scott Baderman
(74) Attorney, Agent, or Firm—Young & Thompson

(57) ABSTRACT

A built-in self-test (BIST) circuit in a DRAM has a test mode controller including a mode counter for selecting based on the count thereof one of a plurality of test modes, and a plurality of test signal generators for generating test control signals based on the selected test mode. A RAM interface executes test of the DRAM based on the test control signals and based on the addresses supplied from an address counter, which counts up or down based on the selected test mode. A plurality of test modes constitutes a test pattern such as column bars, checker board and marching.

3 Claims, 6 Drawing Sheets

FIG. 5

|  | Counter19 | Up/Dn | R/W sel | dataw | datae |
|---|---|---|---|---|---|
| wait | 0 | – | – | – | – |
| marching | 1 | 0 | 1 | 0 | – |
|  | 2 | 0 | 2 | 1 | 0 |
|  | 3 | 0 | 2 | 0 | 1 |
|  | 4 | 1 | 2 | 1 | 0 |
|  | 5 | 1 | 2 | 0 | 1 |
|  | 6 | 2 | 2 | 1 | 0 |
|  | 7 | 3 | 2 | 0 | 1 |
| checker boards | 8 | 0 | 1 | 2 | – |
|  | 9 | 0 | 0 | – | 2 |
|  | 10 | 0 | 1 | 3 | – |
|  | 11 | 0 | 0 | – | 3 |

FIG. 6

| Counter45 | CS | RAS | CAS | WE | AX | AY | din | dout |
|---|---|---|---|---|---|---|---|---|
| 0,1,2 | 0 | 0 | 0 | 0 | – | – | – | – |
| 3 | 1 | 1 | 0 | 1 | – | – | – | – |
| 4,5,6 | 0 | 1 | 0 | 1 | – | – | – | – |
| 7 | 1 | 1 | 0 | 0 | AX | – | – | – |
| 8,9,10 | 0 | 1 | 0 | 0 | – | – | – | – |
| 11 | 1 | 0 | 1 | 0 | – | AY | – | – |
| 12,13 | 0 | 0 | 1 | 0 | – | – | – | – |
| 14,15,16 17,18 | 0 | 0 | 1 | 1 | – | – | dataw | datae |
| 19 | 0 | 0 | 0 | 0 | – | – | – | – |

BUILT-IN SELF-TEST CIRCUIT FOR A MEMORY DEVICE

BACKGROUND OF THE INVENTION (a) Field of the Invention

The present invention relates to a built-in self-test (BIST) circuit in a memory device and, more particularly, to a BIST circuit suitably used for an LSI that includes a logic circuit and a DRAM (dynamic random access memory) section.

(b) Description of a Related Art

Product test of a memory device such as a DRAM is generally conducted by using an external memory tester which includes a microprocessor for generating test patterns for testing the DRAM. The test patterns necessary to test the functions of the DRAM include column bars, checker board, marching, shifted diagonal test and other test patterns.

In the control by the column bars, the memory tester:

(1) stores "1" in the cells (or addresses) in odd numbered columns and "0" in the cells in even numbered columns, (2) consecutively reads the data stored in each cell in the order specified, and (3) iterating the storing and reading the data by exchanging data "1" and "0" in each memory cell.

In the control by the checker board, the memory tester:

(1) stores "0" and "1" in the cells alternately in odd numbered columns and stores "1" and "0" in the cells in even numbered columns, (2) reads the data stored in each cell in the order specified, and (3) iterating the storing and reading the data by exchanging data "1" and "0" in each memory cell.

In the control by the marching, the memory tester:

(1) stores "0" in all the cells, (2) reads the data stored in each cell in the order specified, and then stores "1" in all the cells, (3) reads the data stored in the cells in the reversed order, and stores "0" in all the cells, and (4) iterating the reading and storing the data by exchanging data "1" and "0" in each memory cell.

There are problems in the product test of the DRAM by using the memory tester for a large number of test patterns, as follows. First, when a system LSI including a logic circuit and a DRAM section is to be tested, both a logic tester and a memory tester are required, which increases the test time to raise the costs for the test operation as well as the cost for the testers. If a tester having a function for testing both the logic circuit and the DRAM section at a time and with a high speed is used for the system LSI, the cost for the tester further increases.

In view of the above problems, a system LSI having a BIST circuit is particularly noticed. The BIST circuit in the system LSI includes both a test pattern generator and a data comparison section. The test pattern generator responds to a test instruction signal for generating test patterns for storing test data in memory cells, whereas data comparison section compares the data read out from the memory cells against the expected data obtained by logical simulation of the normal LSI to judge the pass/fail of the DRAM in the system LSI.

The BIST circuits are categorized into two different systems including a micro-instruction control system, such as described in JP-A-10-69799 and a hardware control system, such as described in JP-A-61-54550, -63-4500 and -8-100536. The micro-instruction control system includes a built-in ROM for storing micro instructions specifying the self test, and has an advantage of design choice.

The micro-instruction control system requires a process for fabricating a ROM section in addition to the processes for fabricating the logic circuit and the DRAM section, which involves a larger circuit scale and higher costs of the system LSI. In addition, in order for testing all the functions of the DRAM as in the case of using an external memory tester, it is necessary to enlarge the circuit scale of the micro-instruction control system, because current micro-instruction control system cannot test the DRAM for all the test patterns.

In the hardware control systems described in the above publications, only the test using the checker board pattern or the patterns modified from the checker board pattern can be executed. Thus, all the desired functions of the DRAM cannot be tested.

SUMMARY OF THE INVENTION

It is therefore an object of the present invention to provide a BIST circuit provided in a DRAM, which is capable of providing a large number of test patterns for the DRAM and thus testing substantially all the functions or any desired functions of the DRAM, and being manufactured in a simple structure.

The present invention provides a built-in self-test (BIST) circuit in a DRAM including a test mode generator for responding to a first signal to select one of a plurality of test modes, a test signal generator for generating a plurality of test control signals based on the selected one of the test modes, an address counter for generating a sequence of addresses based on the selected one of the test modes, a test execution section for executing a test of memory cells specified by the sequence of addresses based on the test control signals, the test execution section outputting the first signal after the memory cells specified by the sequence of addresses are tested based on the selected one of the test modes.

In accordance with the BIST circuit of the present invention, any combination of test patterns can be generated by selecting the configuration of the test signal generator in the BIST circuit having a simple structure.

The above and other objects, features and advantages of the present invention will be more apparent from the following description, referring to the accompanying drawings.

BRIEF DESCRIPTION OF THE DRAWINGS

FIG. 5 is an exemplified table showing the signal patterns generated in the test mode controller shown in the BIST circuit of FIG. 1.

FIG. 6 is an exemplified table showing the signal patterns generated in the read/write circuit shown in FIG. 1.

PREFERRED EMBODIMENT OF THE INVENTION

Now, the present invention is more specifically described with reference to accompanying drawings, wherein signal lines for transferring the system clock pulses and the system reset signals are omitted for simplification.

Figure 1:
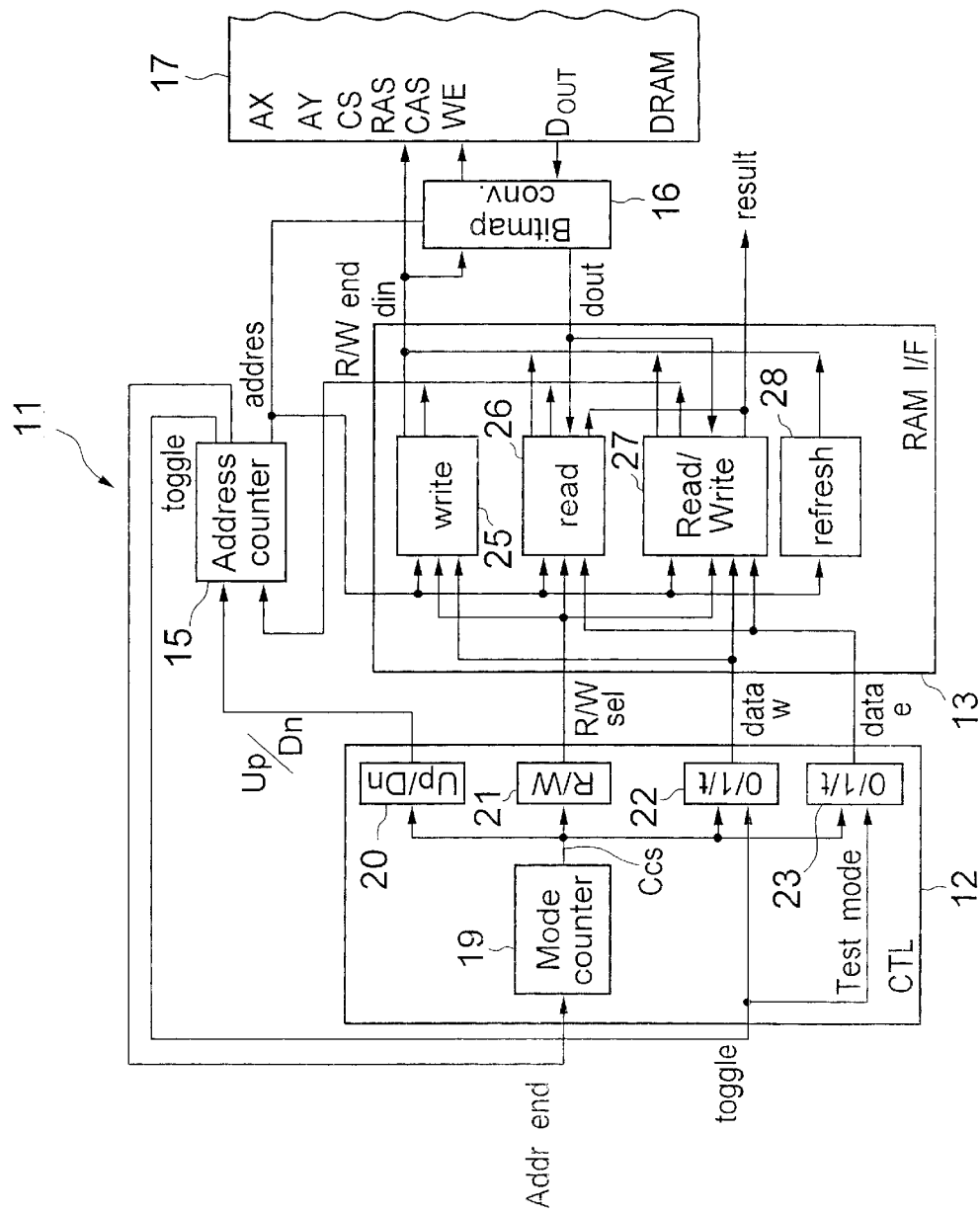
FIG. 1 is a block diagram of a BIST circuit in a LSI according to an embodiment of the present invention.

Referring to FIG. 1, a BIST circuit, generally designated by numeral 11, according to an embodiment of the present invention includes a test mode controller 12, a RAM interface 13, an address counter 15 and a bitmap converter 16. The BIST circuit 11 is built in a DRAM 17 or in a system LSI including a DRAM 17 for testing the function of the DRAM 17. In the BIST circuit 11 of FIG. 1, the configurations for allowing the DRAM 17 to operate in a burst mode with a specified burst length, as well as in the CAS (column address strobe) latency, are determined by the user.

The BIST circuit 11 consecutively generates a plurality of test patterns for testing the DRAM 17 based on the counts (or common control signals) Ccs supplied by the mode counter 19 in the test mode controller 12. The term "test mode" as used herein means a write test, a read test or a read/write test for a series of memory cells in a DRAM, and a plurality of test modes generally constitute a test using a single test pattern, such as column bars or checker board.

The test mode controller 12 includes the mode counter 19 as mentioned above, and also includes a first decoder 20 for generating an Up/Down control signal "Up/Dn", a second decoder 21 for generating a read/write selection signal "R/W sel", i.e., a read, write or read/write signal for selecting a read mode, a write mode or a read/write mode, a third decoder 22 for generating write data "dataw", and a fourth decoder 23 for generating expected data "datae" for read data, all based on a count, or common control signal "Ccs", output by the mode counter 19.

In this configuration, the test mode controller 12 selects, based on the count Ccs output from the mode counter 19, an ascending order or a descending order for the addresses of memory cells in the DRAM 17 through the first decoder 20, a write operation, a read operation or a read/write operation for the DRAM 17 through the second decoder 21, data "0" or "1" for the write data through the third decoder 22 if the current operation is a write operation or a read/write operation, and expected data for comparison through the fourth decoder 23 if the current operation is a read operation or a read/write operation.

The test patterns generated by the BIST circuit of FIG. 1 include any combination of column bars, checker board, marching, shifted diagonal, butterfly, walking, galloping etc.

In the DRAM 17, the memory cell located on i-th row and j-th column (i=1,2,3, ... n, and j=1,2,3, ... n) is represented by Cij, wherein the DRAM 17 has a memory cell array which includes n×n memory cells. In this case, the number "N" of memory cells is $N=n^2$. The access order of all the memory cells is based on the order of $C_{11}$, $C_{21}$, $C_{31}$, ..., $C_{n1}$, $C_{12}$, $C_{22}$, $C_{32}$, ..., $C_{n2}$, ..., $C_{1n}$, $C_{2n}$, $C_{3n}$, ... $C_{nn}$, and p-th memory cell in this order is represented by $C_p$ wherein p=0, 1, 2, ... N−1. In the product test, the addresses are determined in the ascending order or a descending order of "p" in the memory cell $C_p$.

If the BIST circuit is to generate a test pattern of column bars, for example, then the BIST circuit:

(1) stores "1" in the memory cells arranged in odd-numbered columns, and "0" in the memory cells arranged in even-numbered columns;

(2) reads the data stored in the memory cells in the order of $C_0$, $C_1$, $C_2$, ... $C_{N-1}$, and (3) iterates (1) and (2) by exchanging "1" and "0".

If the BIST circuit is to generate a pattern of checker board following the column bars, then the BIST circuit:

(4) stores alternately "0" and "1" in odd-numbered columns, and stores alternately "1" and "0" in even-numbered columns;

(5) reads data stored in all the memory cells in the order of $C_0$, $C_1$, $C_2$, ... $C_{N-1}$; and (6) iterates (4) and (5) by exchanging "0" and "1".

Alternatively, a burst operation can be conducted wherein a block of columns including the first to eighth columns, for example, are subjected to a single read, write or read/write operation in a row with a single address signal.

The mode counter 19 receives an address end flag "Addr end" from the address counter 15 each time a single read, write or read/write operation is executed for a series of addresses of the memory cells in the DRAM 17. The mode counter 19 increments the count Ccs thereof each time the address end flag is set, thereby shifting into a next test mode to allow each of the decoders 20 to 23 to set a new specified value in accordance with the next test mode. The configurations of the decoders 20 to 23 which are generally implemented by respective logic circuits are determined based on the test modes in desired test patterns. The decoders 22 and 23 are controlled also by an output "toggle" from the address counter 15 to output either data "0", "1" or "toggle". The signal "toggle" as used herein means alternate occurrence of "1" and "0" or "0" and "1", which can be generated by passing the least significant bit of the X-address specified by the address counter 15 or the inversion thereof.

The RAM interface 13 includes a write circuit 25, a read circuit 26, read/write circuit 27 and a refreshing circuit 28, and executes a sequence of read, write or read/write operation by generating data and control signals for the read, write or read/write operation. The refreshing circuit 28 is activated each time the address counter 15 delivers 100 addresses, for example, to refresh data in all the memory cells of the DRAM 17.

The Up/Down control signal "Up/Dn" is input from the first decoder 20 to the address counter 15, which counts up or counts down based on the Up/Down control signal. The read/write selection signal "R/W sel" is input from the second decoder 21 to the write circuit 25, the read circuit 26 and the read/write circuit 27, thereby allowing the write circuit 25 to operate write operation, the read circuit 26 to operate a read operation, or the read/write circuit 27 to operate both read and write operation in the current test mode. The write data "dataw" are supplied from the third decoder 22 to both the write circuit 25 and the read/write circuit 27, and assumes either "0", "1" or "toggle". The expected data "datae" is input from the fourth decoder 23 to the read circuit 26 and the read/write circuit 28 for indicating the expected logical value which the data read from the specified memory cell should assume, and assumes "0", "1" or "toggle".

The RAM interface 13 supplies control signals and the write data "din" and receives read data "dout" through the bitmap converter 16 to and from the DRAM 17. The write circuit 25, read circuit 26 and read/write circuit 27 set a read/write end flag "R/W end" each time a read, write or read/write operation for a single address is completed. The read circuit 26 and the read/write circuit 27 output results of comparison between the expected logical value and the stored data read from the DRAM 17.

The address counter 15 includes a counter and associated logic gates, sets the address of the DRAM 17 and generates toggle data as a write data for the DRAM 17. Specifically, the address counter 15 determines the address of the DRAM 17 when data is stored/read to and from the DRAM 17 based on the test patterns supplied from the write circuit 25, read circuit 26 and the read/write circuit 27. The address counter 15 increments or decrements the counts thereof each time a read/write end flag "R/W end" is set, depending on the Up/Down control signal "Up/Dn" supplied from the first decoder 20, to supply an address end signal "Addr end" to the mode counter 19 of the test mode controller 12 if a series of write operations etc. are completed.

The bitmap converter 16 is connected to the DRAM 17, and has functions for inverting the logical value based on the physical condition of the DRAM 17 and for increasing the number of bits from a single bit data. The bitmap converter 16 delivers the data "Dout" read from the DRAM 17 as it is (as data "dout") or after converting the data "Dout" into bitmapped data "dout".

The DRAM 17 has ordinary input terminals including a chip selection terminal CS, a row address strobe terminal RAS, a column address strobe terminal CAS and a write enable terminal WE, generally used in the typical DRAM. Ax and Ay as shown in the DRAM indicate the X-address and Y-address, respectively, delivered in association with the RAS and CAS.

Figure 2:
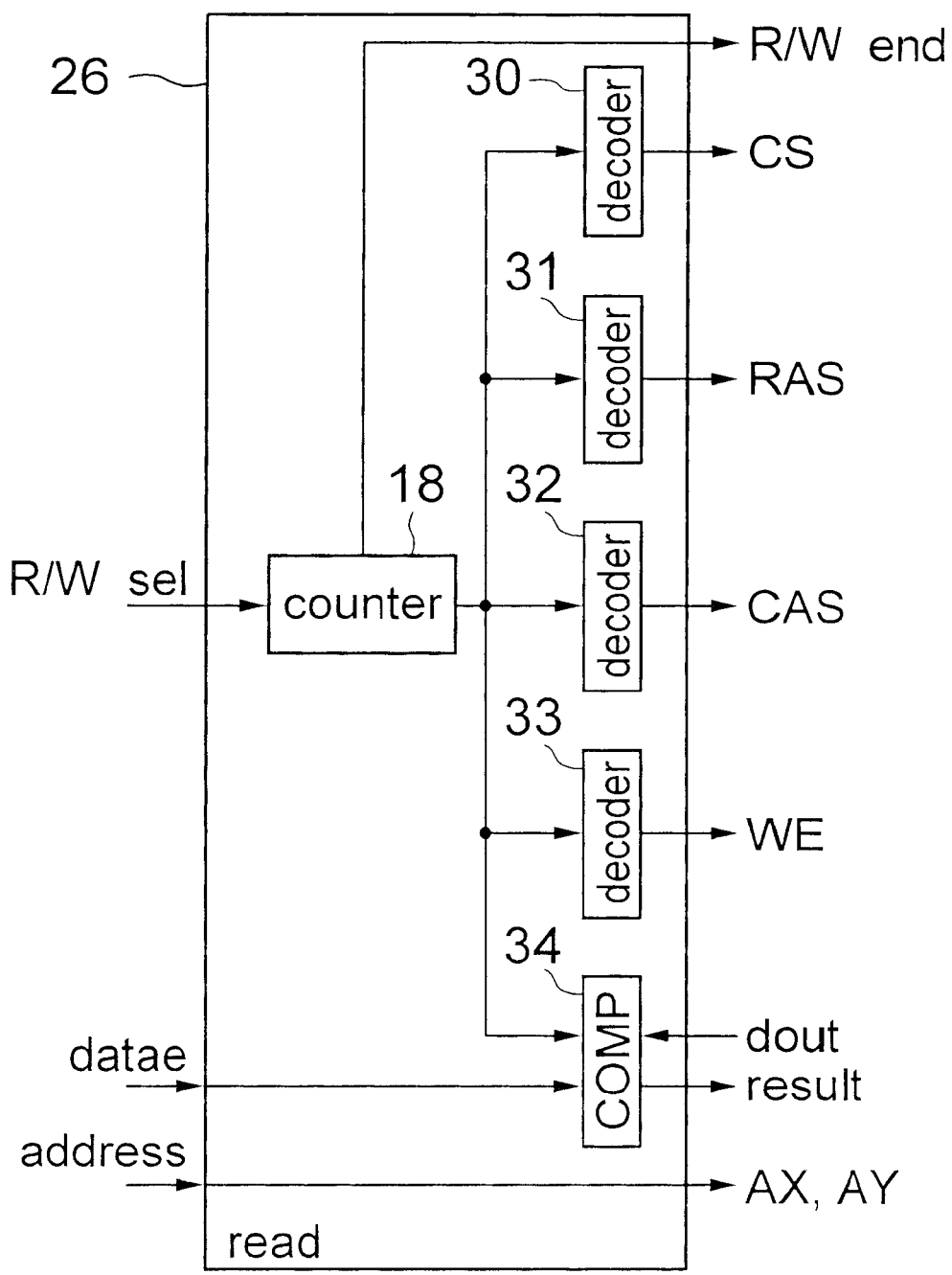
FIG. 2 is s block diagram of the read circuit shown in the BIST circuit of FIG. 1.

Referring to FIG. 2, the read circuit 26 shown in FIG. 1 includes a data counter 18 activated by a read selection signal from the decoder 21 for counting clock pulses of a clock signal, and first through fourth decoders 30 to 33 and a comparator 34 which receive the count signal from the data counter 18. While the data counter 18 counts the clock pulses from zero to a specified count, first decoder 30 decodes the counts to output a chip selection signal CS, the second decoder 31 decodes the count to output a row address strobe RAS, the third decoder 32 decodes the count to output a column address strobe CAS and the fourth decoder decodes the count to output a write enable signal WE. The read circuit 26 passes an address data "address" supplied from the address counter 15 to the DRAM 17 as X-address and Y-address.

The comparator 34 responds to a specified count of the data counter 18 to operate for comparison between the read data "dout" supplied from the bitmap converter 16 and the expected data "datae", thereby outputting the result of the comparison. The relationships between the data counter 18 and the outputs of the respective decoders 30 to 33, i.e., the outputs of the decoders 30 to 33 with respect to an output from the data counter 18, depend on the specification of the DRAM 17 specified by the user and the parameters including CAS latency and the burst length specified beforehand.

Figure 3:
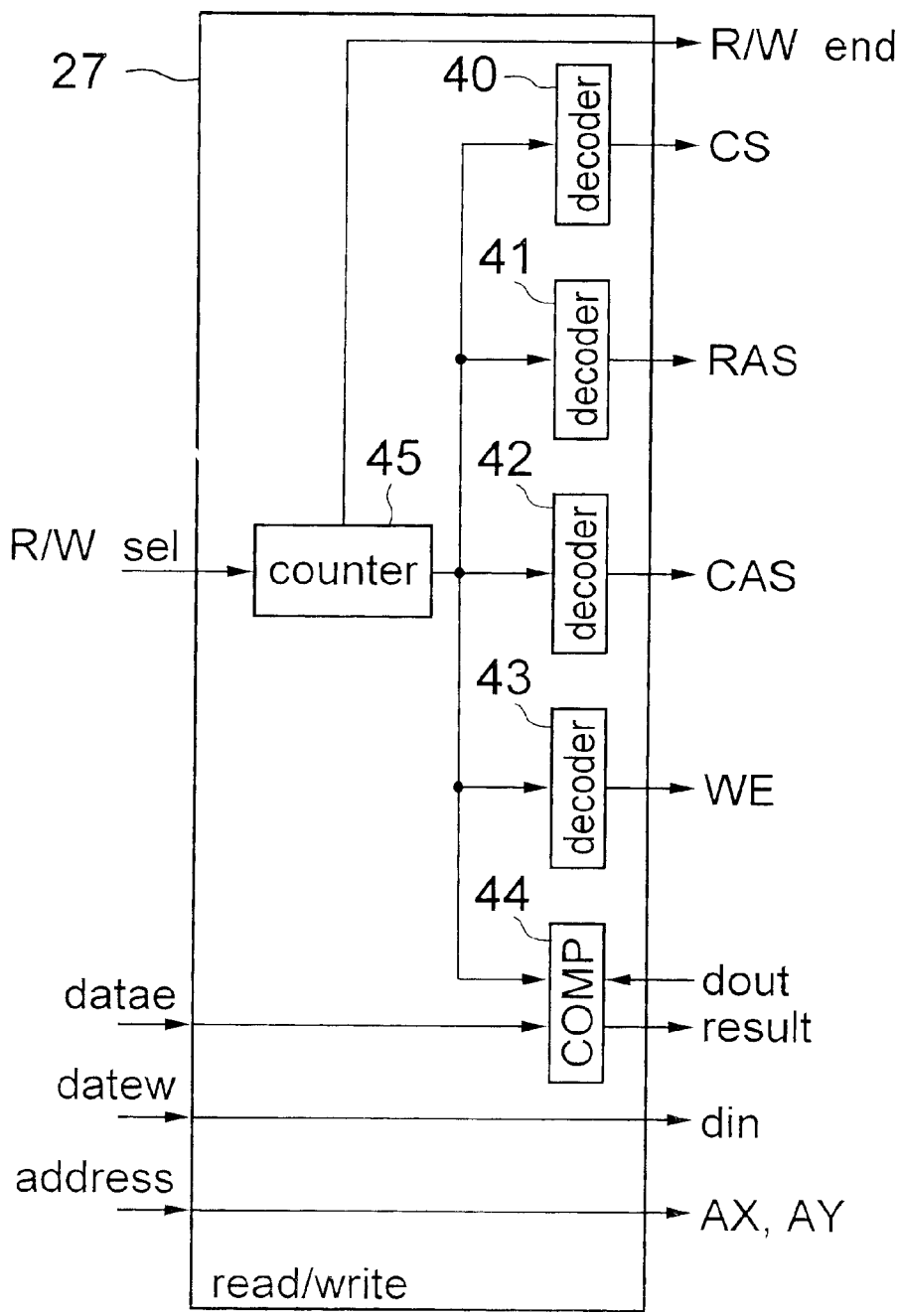
FIG. 3 is a block diagram of the read/write circuit shown in the BIST circuit of FIG. 1.

Referring to FIG. 3, the read/write circuit 27 shown in FIG. 2 includes a data counter 45 activated by a read/write signal supplied from the decoder 21 for up/down counting based on the clock pulses, and first through fourth decoders 40 to 43 and a comparator 44 which receive the count signal from the data counter 45. While the data counter 45 counts the clock pulses from zero to a specified count, first decoder 40 decodes the count to output a chip selection signal CS, the second decoder 41 decodes the count to output a row address strobe RAS, the third decoder 42 decodes the count to output a column address strobe CAS and the fourth decoder 43 decodes the count to output a write enable signal WE. The read/write circuit 27 passes write data "dataw" to the DRAM 17 as data "din", and also passes an address data "address" supplied from the address counter 15 to the DRAM 17 as X-address and Y-address.

The comparator 44 responds to a specified count of the data counter 45 to operate for comparison between the read data "dout" supplied from the bitmap converter 16 and the expected data "datae", thereby outputting the result of the comparison. The relationships between the data counter 45 and the outputs of the respective decoders 40 to 43, i.e., the outputs of the decoders 40 to 43 with respect to an output from the data counter 45, depend on the specification of the DRAM 17 specified by the user and the parameters including CAS latency and the burst length specified beforehand.

The write circuit 25 and the refreshing circuit 28 have configurations similar to those of the read circuit 26 and the read/write circuit 27 except for the differences of the functions, and the detailed description thereof are omitted here.

Figure 4:
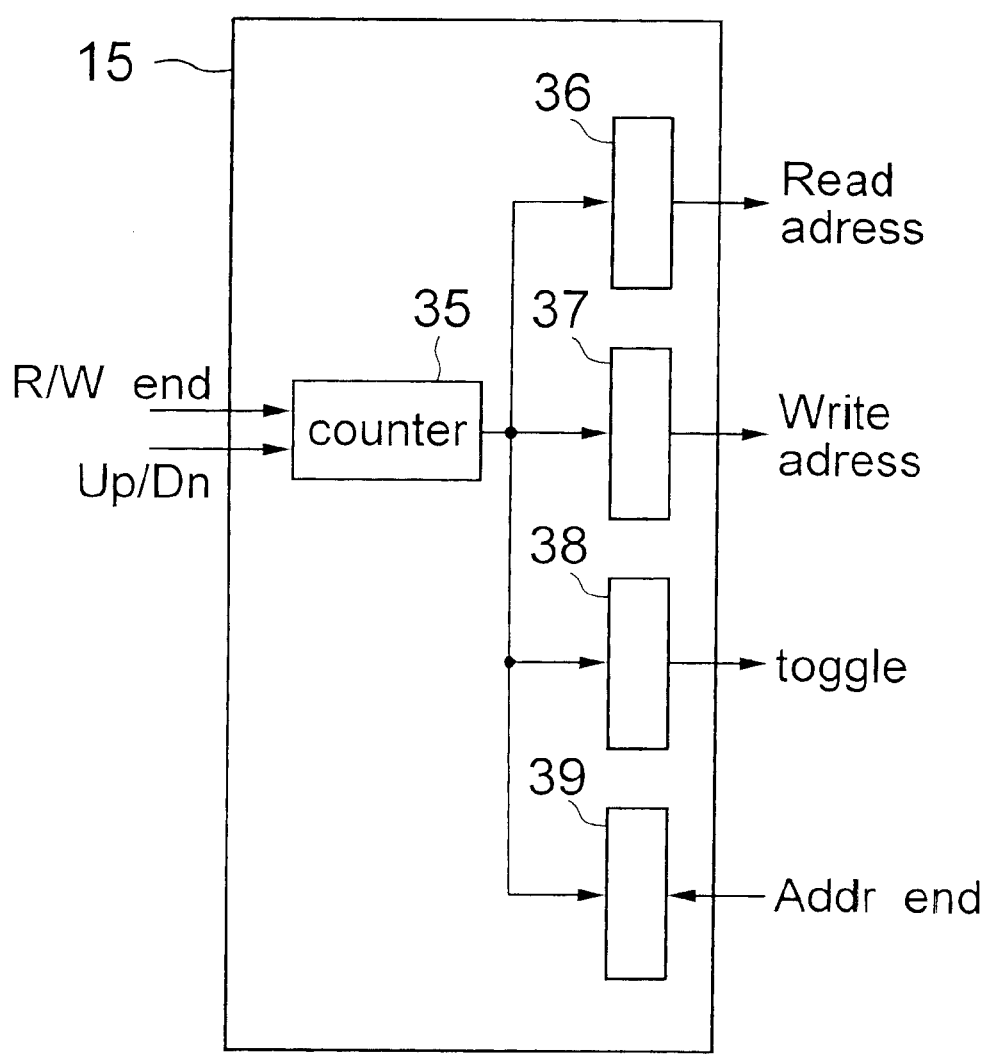
FIG. 4 is a block diagram of the address counter shown in the BIST circuit of FIG. 1.

Referring to FIG. 4, the address counter 15 shown in FIG. 1 includes an Up/Down counter 35 and associated logic circuits or decoders 36 to 39. The Up/Down counter 35 receives and counts the one-address end signal "R/W end" supplied from the RAM interface 13, wherein the direction of the counts is based on the Up/Down control signal supplied from the test mode controller 12. The logic circuits 36 to 39 receive the count of the Up/Down counter 35 to deliver, based on the count, a read address, a write address, a "toggle signal" that is used as write data, and an address end signal (or test mode end signal), respectively. The toggle signal can be generated by selecting the least significant bit (LSB) of the addresses consecutively supplied to the DRAM 17. The address end signal "Addr end" indicates that a series of accesses are conducted to the last address. When the test pattern is directed to column bars, checker board or marching, since the addresses to be accessed can be generated by a simple count-up or countdown, the logic circuits 36 to 39 may merely pass the count by the Up/Down counter 35.

If the test pattern is directed to column bars, the logic circuit 38 passes LSB of the addresses as it is each time the counter 35 counts, whereas if the test pattern is directed to checker board, the logic circuit 38 reverses LSB of the addresses each time the counter 35 counts. If the test pattern is directed to walking or galloping, since the number of counts by the counter 35 is double the total address number of the DRAM, the logic circuit 36 adds lesser significant bits of the read address to the write address, whereas the logic circuit 37 adds more significant bits of the read address to the read address. If the test pattern is directed to galloping, the logic circuit 38 compares the lesser significant bits against the more significant bits.

Referring to FIG. 5, there is shown the function of the test mode controller 12 by a data table showing the outputs of the counter 19 and the decoders 20 to 23 in the test mode controller 12. In this table, the test patterns including marching and checker boards are exemplarily shown, although the BIST circuit can generate a combination of any test patterns.

When the test mode counter 19 is reset to deliver count "0", the BIST circuit generates initialization signals for initializing the DRAM 17. When the test mode counter 19 counts from "1" to "7" as shown in the table, the BIST circuit generates a test pattern of marching, and when the test mode counter 19 counts from "8" to "11", the BIST circuit generates a test pattern of checker boards.

More specifically, when the test mode counter 19 delivers count "1", the first decoder 20 delivers "0" as the Up/Down control signal which allows the address counter 15 to count up X-address one by one and increment Y-address by a burst length after X-address reaches the final address, the second decoder 21 delivers "1" as the operational mode of the DRAM which indicates a write mode, the third decoder 22 delivers "0" as the write data, and the fourth decoder 23 does not deliver an output. Thus, write data "0" is consecutively stored in all the addresses of the DRAM 17 in the ascending order while using a burst write mode.

When the counter 19 delivers count "2", the first decoder 20 remains the same to indicate up-counting, the second decoder 21 delivers count "2" which indicates a read/write mode of the DRAM 17, the third decoder 22 toggles the write data from "0" to "1", and the fourth decoder 23 delivers "0" as an expected data which is equal to the previous write data. Thus, the BIST circuit operates both for reading and writing operations by reading data from all the addresses of the DRAM 17 in a burst read mode to compare the read data against the expected data "0" before storing write data "1" into all the addresses of the DRAM 17 in this mode.

When the counter 19 delivers count "3", the outputs of the first and the second decoders 20 and 21 remain the same, the third and fourth decoders 22 and 23 reverse their outputs, whereby the BIST circuit reads data from all the addresses of the DRAM 17 in the ascending order of the addresses to compare the read data against the expected data "1" which is equal to the previous write data, before the BIST circuit stores write data "0" in all the addresses in this mode.

When the counter delivers count "4" and "5", the first decoder 20 delivers "1" as Up/Down control signal which indicates down-counting by the address counter 15, the second decoder 21 remains the same, the third and fourth decoders 22 and 23 reverse their outputs. Thus, the BIST circuit iteratively reads data in the descending order of the addresses, before storing write data in these modes.

When the counter delivers count "6", the first decoder delivers "2" as an Up/Down control signal which indicates up-counting of bank numbers while specifying X-address and increasing Y-address by a burst length, and incrementing X-address after the final bank number is accessed, whereas the third and fourth decoders 22 and 23 reverse their outputs.

When the counter delivers count "7", the first decoder delivers "3" as the Up/Down control signal which indicates down-counting of bank numbers while specifying X-address and decreasing Y-address by a burst length and decrementing X-address after the final bank number is accessed, whereas the third and fourth decoders reverse their outputs.

In the test pattern for the checker boards, when the counter 19 delivers count "8", the first through third decoders 20 to 22 delivers "0", "1" and "2", respectively, and fourth decoder 23 dose not deliver an output. The output "2" delivered by the third decoder 22 as a read/write selection signal indicates that data "0" is to be stored in the addresses of odd-numbered column banks and data "1" is to be stored in the addresses of the even-numbered column banks. When the counter 19 delivers count "9", the BIST circuit operates for a read mode of the stored data to compare the read data against expected data which are equal to the previous write data. When the counter 19 delivers count "10", the BIST circuit operates for a write mode wherein data "1" is stored in the addresses of the odd-numbered column banks whereas data "0" is stored in the addresses of the even-numbered column banks. When the counter 19 delivers count "11", the BIST circuit operates for a read mode of the stored data to compare the read data against expected data which are equal to the previous write data.

Referring to FIG. 6, there is shown the function of the read/write circuit 27 by a data table showing the outputs of the counter 45 and the decoders 40 to 43 and the data passing the read/write circuit 27. The read/write circuit 27 is activated by data "2" output from the second decoder 21 of the test mode controller 12 as a read/write selection signal.

After the address counter 15 increments to specify a memory cell, while the counter 45 delivers counts "0", "1" and "2", the read/write circuit 27 stays in a waiting state.

When the counter 45 delivers count "3", logic circuits 40 to 43 deliver "1", "1", "0" and "1", respectively, whereby the read/write circuit 27 executes precharge of the bank including the specified memory cell if the specified memory cell is the first cell, and stays in a waiting state if the specified memory cell is the second to the last cells. While the counter 45 delivers counts "4", "5" and "6", the read/write circuit 27 stays in a waiting state.

When the counter 45 delivers count "7", logic circuits 40 to 43 deliver "1", "1", "0" and "0" and the read/write circuit passes X-address supplied based on the count by the address counter 15, whereby X-address is supplied to the DRAM 17 with the chip selection signal being activated. While the counter 45 delivers "8", "9" and "10", the read/write circuit stays in a waiting state. When the counter 45 delivers count "11", logic circuits 40 to 43 deliver "1", "0", "1" and "0" and the read/write circuit 27 passes Y-address, whereby Y-address is supplied to the DRAM. While the counter delivers counts "12" and "13", the read/write circuit stays in a waiting state while the DRAM stores Y-address in the column address decoder thereof. The number of counts including counts "12" and "13" depends on the CAS latency, which is two in this case.

While the counter delivers counts "14" to "18", logic circuits deliver "0", "0", "1" and "1", whereby the data stored in the specified memory cell is read therefrom, and compared against the expected data "datae" and then a new write data "dataw" is stored in the memory cell. The number of counts including counts "14" to "18" depends on the burst length, which is five in this case. When the counter 45 delivers count "19", the read/write circuit stays in a waiting mode, followed by a reset of the counter 45 to count "0", which is informed to the address counter 15 by a read/write end flag set in the RAM interface 13.

The address counter 15, after received the read/write end signal, increments or decrements its count depending on the Up/Down control signal to specify a next memory cell to be subjected to a read/write operation. Thus, a new toggle data is supplied from the address counter 15 to the read/write circuit 27 through the third decoder 22 in the test mode controller 12. The read/write circuit 27 then reads/writes data from and to the next memory cell. After all the memory cells are consecutively subjected to the read/write operation in this mode, the address counter 15 sets an address end flag, which is supplied to the test mode controller 12. The test mode controller 12 increments its count to indicate a next test mode in the test pattern or a new test pattern based on the current count of the mode counter 19.

The operation of the read circuit 25, the write circuit 26 and the refresh circuit 28 may be understood from the operation of the read/write circuit 27 without further description.

The bitmap converter 16 receives address from the address counter 15 and write data "din" from the RAM interface 13, and receives read data Dout from the RAM 17. The bitmap converter 16 reverses the read data Dout from "0" to "1" or from "1" to "0", if it is instructed that the read data from a specified address be inverted. The bitmap converter 16 also reverses the write data if it is instructed that the write data from a specified address be inverted.

In the BIST circuit of the present embodiment, each of the test mode controller 12, write circuit 25, read circuit 26, read/write circuit 27, refresh circuit 28 and address counter 15 can be implemented by a counter and a plurality of logic circuits. The configuration of these circuits can be designed based on the desired test patterns to be used for testing a DRAM. The test patterns may include all the test patterns necessary to test all the functions of the DRAM or may be limited to testing the desired functions.

Since the above embodiments are described only for examples, the present invention is not limited to the above embodiments and various modifications or alterations can be easily made therefrom by those skilled in the art without departing from the scope of the present invention.

What is claimed is:

1. A built-in self-test (BIST) circuit in a DRAM comprising:

a test mode generator for responding to a first signal to select one of a plurality of test modes;

a test signal generator for responding to said first signal to generate a plurality of test control signals based on said selected one of said test modes;

an address counter for generating a sequence of addresses based on said selected one of said test modes; and a test execution section for executing a test of memory cells specified by said sequence of addresses based on said test control signals, said test execution section outputting said first signal after said memory cells specified by said sequence of addresses are tested based on said selected one of said test modes, wherein said test signal generator generates an up/down control signal for specifying a direction of count by said address counter, a read/write selection signal for indicating a read operation, a write operation or a read/write operation, write data for storing in said memory cells, and expected data against which read data is to be compared, wherein said test execution section comprises a write section, a read section, and a read/write section and wherein each of said write section, said read section and said read/write section comprises a counter and a plurality of logic circuits.

2. The BIST circuit as defined in claim 1, wherein data stored in said memory cell are calculated based on said sequence of addresses.

3. The BIST circuit as defined in claim 1, wherein said test execution section further comprises a refreshing section for refreshing said memory cells.

* * * * *